United States Patent [19]

Hornak et al.

[11] Patent Number: 4,565,961
[45] Date of Patent: Jan. 21, 1986

[54] CIRCUIT FOR PRESERVING THE MAGNITUDE OF THE DC COMPONENT IN A PULSED CURRENT SOURCE

[75] Inventors: Thomas Hornak, Portola Valley; Gary L. Baldwin, Palo Alto, both of Calif.

[73] Assignee: Hewlett-Packard Company, Palo Alto, Calif.

[21] Appl. No.: 611,802

[22] Filed: May 18, 1984

[51] Int. Cl.$^4$ .............................................. G05F 1/46
[52] U.S. Cl. ............................ 323/312; 340/347 DA; 340/347 CC
[58] Field of Search ...................... 323/312, 311, 317; 340/347 DA, 347 CC

[56] References Cited

U.S. PATENT DOCUMENTS

| | | | |
|---|---|---|---|
| 4,225,816 | 9/1980 | Schade | 323/317 |
| 4,458,201 | 7/1984 | Koen | 323/317 |

Primary Examiner—William H. Beha, Jr.
Attorney, Agent, or Firm—John A. Frazzini

[57] ABSTRACT

A pulsed current source in which the dc component of the pulsed current is independent of variations in the duty cycle of the current pulses. A dc current source supplies a current I through a switch that alternately switches the current between a first output and a second output to produce at the first output the pulsed current $I_p$. The dc component of the current at the second output is added to the current I, thereby making the dc component of the pulsed current insensitive to the duty cycle. In systems in which additional processing produces from $I_p$ a set of currents, the dc component of the sum of a first subset of these currents is made to equal I by adding to the input of the switch the dc component of the sum of those currents in the complement of the first subset.

4 Claims, 3 Drawing Figures

CIRCUIT FOR PRESERVING THE MAGNITUDE OF THE DC COMPONENT IN A PULSED CURRENT SOURCE

BACKGROUND AND SUMMARY OF THE INVENTION

This invention relates in general to pulsed current sources and more particularly to a circuit that maintains the magnitude of the dc component of the current pulses. In a number of applications in which a pulsed current source is utilized, it is important to preserve the magnitude of the dc component of the current pulses. A particular source of error in the dc component is caused by variations in the duty cycle of the pulses.

An example of a device in which maintenance of the magnitude of the dc component is important is shown in FIG. 3 and is discussed in detail in copending patent application by Thomas Hornak and Gary L. Baldwin entitled "A Binary Scaled Current Array Source For Digital to Analog Converters". FIG. 3 is a block diagram of a binary scaled current source which produces a set of n dc currents $I_1, \ldots, I_n$. Such a current source is useful in a digital to analog converter which, in response to an n bit binary number, directs selected ones of the $I_k$ to the output of the digital to analog converter to produce an output current proportional to the binary number. In particular, the kth bit is directed to the output if and only if the kth least significant bit of the binary number is a one.

In FIG. 3, a current source 31 produces a dc current I that is switched by a pair of switches $M_{C0}$ and $M_{C1}$ such as transistors 32 and 33. Switch 32 is responsive to a clock signal CLK and switch 33 is responsive to the complement $-$CLK of the clock signal so that the current I is conducted through switch 32 to rail 34 only when CLK is high. In effect, dc current source 31 and switches 32-33 function as a pulsed current source 35. A set of control signals $B_0, \ldots, B_n$ control a set of switches $M_0, \ldots, M_n$ in an upper stage 37 of the binary scaled current source such that the dc currents $I_1, \ldots, I_n$ generated by low pass filters LPF are related by $I_k = 2^{k-1} * I_1$. Unfortunately, the absolute value of these dc currents can vary if the duty cycle of CLK varies. The effect of this on the digital to analog converter would be that the scale of the output current would not be accurately known.

In accordance with the illustrated preferred embodiment of the present invention shown in FIG. 2, the dc component of the current through switch 14 and currents $I_{n+1}, \ldots, I_{n+m}$ are not dumped to ground as is done in FIG. 3 for currents $i_0$ and $I_{C1}$, but instead are supplied through a floating power supply that is a.c. bypassed to ground back to input A of switches $M_{C0}$ and $M_{C1}$. In effect, the d.c. component of the current through switch $M_{C1}$ flows around a first loop that passes through node A. Similarly, the currents $I_{n+1}, \ldots, I_{n+m}$ also flow around a second loop that passes through node A. Therefore, all of the current I from source 22 must pass through switches $M_1, \ldots, M_n$ and therefore the sum of the currents $I_1, \ldots, I_n$ is I, regardless of the duty cycle of CLK. The effect of this is that the magnitudes of the currents $I_k$ (for k=1 to n) are unaffected by variations in the duty cycle of CLK.

DESCRIPTION OF THE PREFERRED EMBODIMENT

Figure 1:
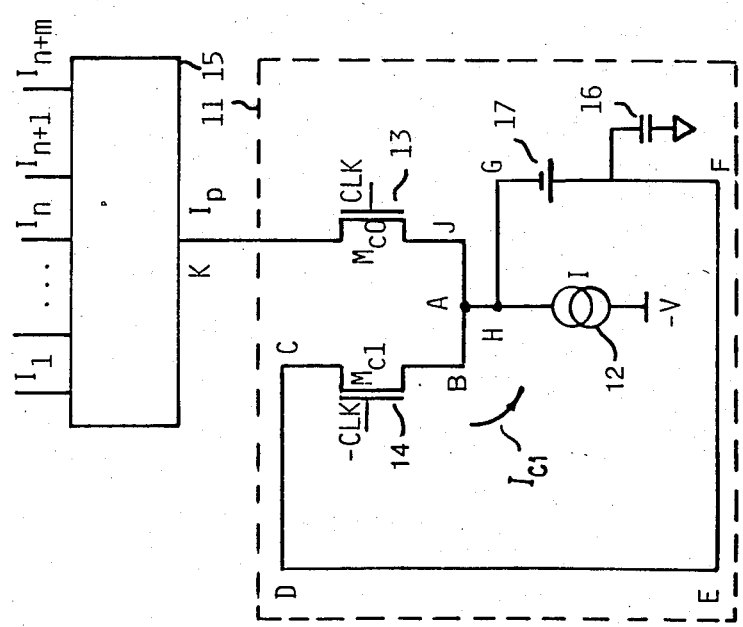
FIG. 1 is a block diagram of a pulsed current source having a dc component that is unaffected by changes in the duty cycle of a clock signal controlling production of the pulses.
Figure 3:
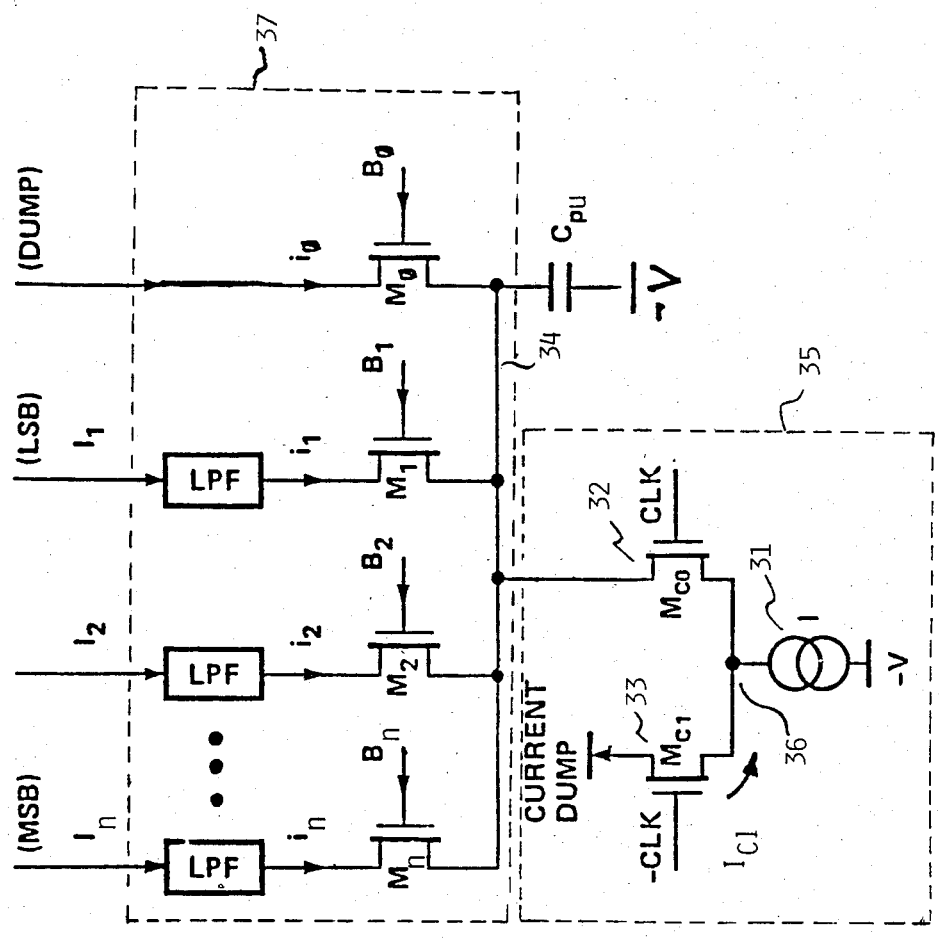
FIG. 3 shows a binary scaled current source for use in a digital to analog converter.

In FIG. 1 is shown a block diagram of a pulsed current source 11 utilizing a current source 12 that provides a current I through an input node A to a pair of switches $M_{C0}$ and $M_{C1}$ such as field effect transistors 13 and 14. Transistors 13 and 14 are responsive to a clock signal CLK and its compleme $-$CLK, respectively. The current through switch 13 is a pulsed current $I_p$ which has current pulses in those intervals in which CLK is high. Such a pulsed current has a number of uses such as in the binary scaled current source of FIG. 3. In general, the pulsed current $I_p$ will be processed by additional circuitry 15 (such as upper stage 37 in FIG. 3) to produce a set of currents $I_1, \ldots, I_{n+m}$, for some integers m and n. In many of these cases it is desirable that the sum of the currents $I_1, \ldots, I_{n+m}$ be a well defined value or that the sum of some subset $I_1, \ldots, I_n$ of the currents be a well defined value. In pulsed current source 11, instead of dumping the current through switch $M_{C1}$ to ground, this current is returned to input node A. A capacitor 16 diverts to ground substantially all of the ac component of the current through switch $M_{C1}$ so that the current from G to H is substantially dc current. As a result of this, the voltage on node A is substantially constant so that the operation of transistors 13 and 14 are not affected by any ac voltage on node A. A floating power supply 17 maintains the drain to source voltage drop required for transistor 14.

The effect of supplying the dc component of the current through switch $M_{C1}$ back to node A is that the dc component $I_{C1}$ of the current through switch $M_{C1}$ flows around a first current loop ABCDEFGHA. Since the dc component of the current through switch $M_{C1}$ is supplied from point G to point H, the dc component of the current through switch $M_{C0}$ is supplied by current source 12. Therefore, the sum of dc currents $I_1, \ldots, I_{n+m}$ is equal to I regardless of the size of the dc component of the current flowing around the first current loop. In particular, if the amount of current in this loop changes because of a change in the duty cycle of CLK, then the currents $I_1, \ldots, I_{n+m}$ will be unaffected. If the duty cycle of CLK decreases so that the dc component of the current flowing around the first loop increases, then there is a corresponding increase in the total dc current provided to input node A. This increases the amplitude in the current pulses through switch $M_{C0}$ just enough to offset the decrease in duty cycle so that the dc component of the current through switch $M_{C0}$ is unaffected by a change in the duty cycle.

Figure 2:
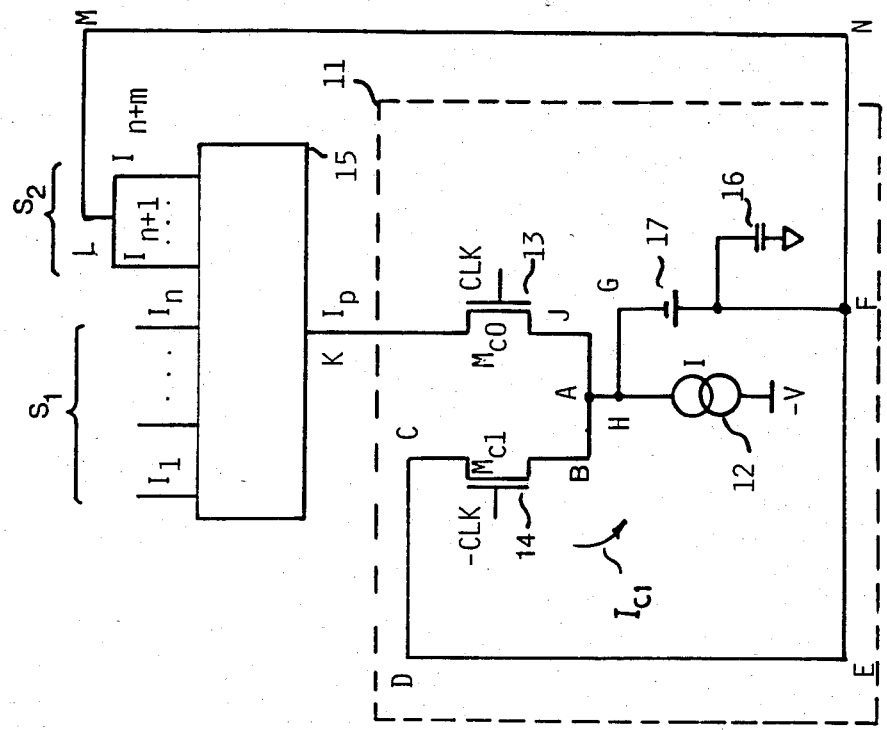
FIG. 2 shows a pulsed current source as in FIG. 1 in which the magnitude of the sum of dc currents $I_1, \ldots, I_n$ is precisely controlled.

In some applications it is desired that a first subset $S_1$ of the currents $I_1, \ldots, I_{n+m}$ be set to a well defined value and be independent of changes in the duty cycle of CLK. A pulsed current source that achieves this result is shown in FIG. 2. In that pulsed current source, the complement of set $S_1$ (namely, set $S_2$) of currents are conducted back to input node A. This results in a second current loop AJKLMNFGHA around which the dc component of this second set of currents travel. The effect of this is that the sum of the first set $S_1$ of currents is equal to I. Since current sources 12 exist that can very precisely produce a current I, the sum of the currents $I_1, \ldots, I_n$ in set $S_1$ can be very precisely controlled. As a consequence of this, the full scale value of the output of a digital to analog converters to which these currents are supplied can also be precisely controlled.

We claim:

1. An improved pulsed current source of the type in which a current I is supplied by a dc current source to the input of a switch which alternately switches the current I between a first output and a second output of the switch to produce at the first output a pulsed current $I_p$, said switch having a duty cycle equal to the fraction of time that current I is directed by the switch to the first output and said improvement comprising:

first loop means for adding the dc component of the current at the second output to the current I supplied to the input of the switch, whereby the dc component of $I_p$ is independent of variations in the duty cycle of the switch.

2. A pulsed current source as in claim 1 wherein the first loop means comprises a low pass filter and a floating power supply connected in series between the second output and the input of the switch.

3. A pulsed current source as in claim 1 further comprising:

processing means, connected to the first switch output, for producing from $I_p$ a set of currents $I_1, \ldots, I_{n+m}$ for some integers m and n, each of these currents $I_1, \ldots, I_{n+m}$ being produced at an output of said processing means; and second loop means, responsive to currents $I_{n+1}, \ldots, I_{n+m}$, for adding the dc component of the sum of the currents $I_{n+1}, \ldots, I_{n+m}$ to the current I supplied to the input of the switch, whereby the dc component of the sum of the currents $I_1, \ldots, I_n$ is equal to I.

4. A pulsed current source as in claim 3 wherein the second loop means comprises a low pass filter and a floating power supply connected in series and also connecting to the input of the switch those outputs of the processing means on which the currents $I_{n+1}, \ldots, I_{n+m}$ are produced.

* * * * *

UNITED STATES PATENT AND TRADEMARK OFFICE
CERTIFICATE OF CORRECTION

PATENT NO. : 4,565,961

DATED : Jan. 21, 1986

INVENTOR(S) : Hornak et al.

It is certified that error appears in the above-identified patent and that said Letters Patent is hereby corrected as shown below:

Column 1, Line 60

"source 22" should read -- source 12 --

Signed and Sealed this

Twenty-second Day of April 1986

[SEAL]

Attest:

DONALD J. QUIGG

Attesting Officer

Commissioner of Patents and Trademarks